US010322931B2

(12) United States Patent
Perletti et al.

(10) Patent No.: US 10,322,931 B2
(45) Date of Patent: Jun. 18, 2019

(54) DRY SCRIBING METHODS, DEVICES AND SYSTEMS

(71) Applicant: STMicroelectronics S.r.l., Agrate Brianza (IT)

(72) Inventors: Matteo Perletti, Boltiere (IT); Pietro Petruzza, Usmate Velate (IT); Ilaria Gelmi, Verano Brianza (IT); Laura Maria Castoldi, Abbiategrasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 144 days.

(21) Appl. No.: 15/651,444

(22) Filed: Jul. 17, 2017

(65) Prior Publication Data

US 2017/0313582 A1    Nov. 2, 2017

Related U.S. Application Data

(63) Continuation of application No. 15/087,732, filed on Mar. 31, 2016, now Pat. No. 9,731,965.

(51) Int. Cl.
*B81C 1/00* (2006.01)

(52) U.S. Cl.
CPC .. *B81C 1/00888* (2013.01); *B81B 2201/0257* (2013.01); *B81B 2207/012* (2013.01)

(58) Field of Classification Search
CPC .................. H01L 2924/1461; B81C 1/00825
See application file for complete search history.

(56) References Cited

U.S. PATENT DOCUMENTS

| | | | |
|---|---|---|---|
| 7,871,832 B2 | 1/2011 | Marinet | |
| 8,942,394 B2 | 1/2015 | Conti et al. | |
| 8,994,022 B2 | 3/2015 | Tailliet | |
| 9,061,248 B1 | 6/2015 | Ferrera et al. | |
| 2014/0191343 A1 | 7/2014 | Kasai et al. | |
| 2014/0353780 A1 | 12/2014 | Perletti et al. | |
| 2015/0264463 A1* | 9/2015 | Kuzuyama | H04R 19/005 381/174 |
| 2016/0137486 A1* | 5/2016 | Bharatan | H04R 19/005 257/416 |

OTHER PUBLICATIONS

"Tutorial for MEMS microphones," AN4426—Application note, DocID025704 Rev 1, Jan. 2014, 18 pages.

* cited by examiner

*Primary Examiner* — Marc Anthony Armand
(74) *Attorney, Agent, or Firm* — Seed IP Law Group LLP

(57) ABSTRACT

A transducer includes a first substrate and an integrated circuit coupled to the first substrate. A sensor is electrically coupled to the integrated circuit and includes a second substrate having a first surface and a second surface opposite the first surface. The second substrate has scribe boundaries defining an outer edge of the second substrate and a chamber extending from the first surface towards but not reaching the second surface. A chamber extends from the second surface to meet the chamber from first surface. Scribe trenches in the second surface at the scribe boundaries have a width from the scribe boundary towards the chamber extending from the second surface. A membrane extends over the first surface and over the chamber extending from first surface. A plate extends from the first surface of the second substrate over the membrane.

20 Claims, 7 Drawing Sheets

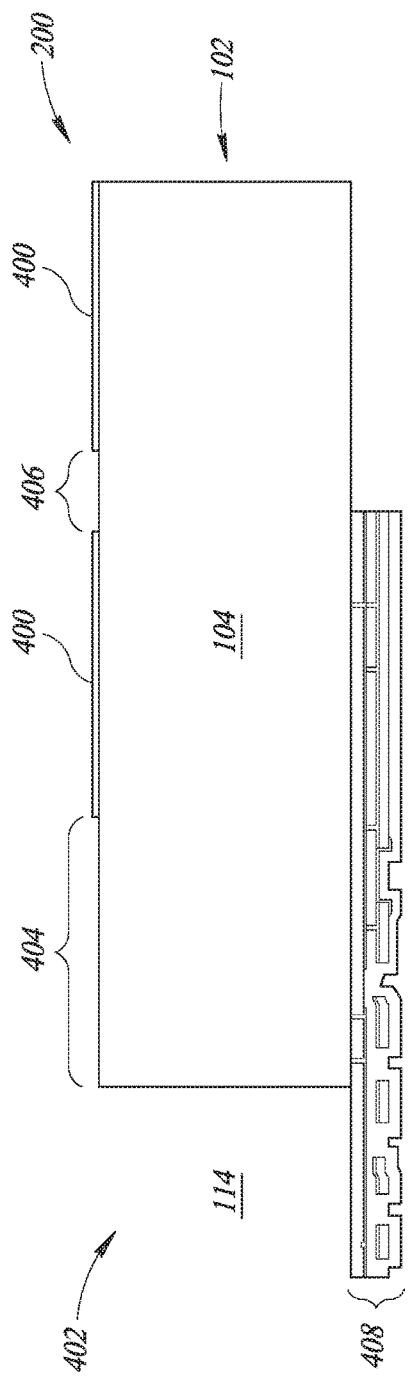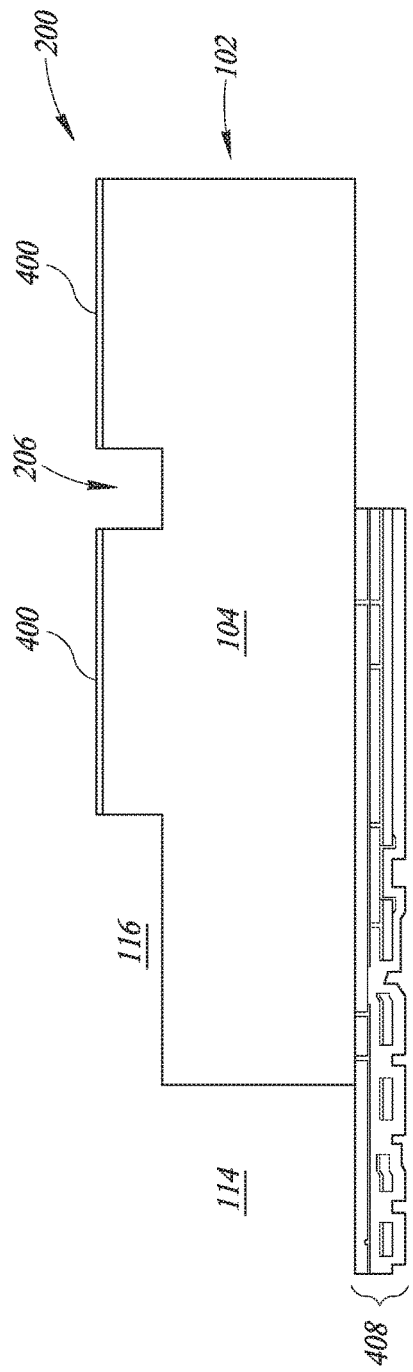

DRY SCRIBING METHODS, DEVICES AND SYSTEMS

BACKGROUND

Technical Field

The present disclosure relates generally to scribe lines for separating dies on a semiconductor wafer, and more specifically to dry scribing utilizing scribe lanes or trenches in separating the dies on the semiconductor wafer.

Description of the Related Art

An acoustic transducer, such as a microelectromechanical systems (MEMS) microphone of a capacitive type, generally includes a detection structure or sensor having a moveable or mobile electrode in the form of a diaphragm or membrane that is arranged facing a fixed electrode. The two electrodes together form the plates of a capacitor. The mobile electrode is generally anchored to a substrate at a perimeter portion of the mobile electrode. A central portion of the mobile electrode is not anchored to the substrate but is suspended over a cavity or chamber formed in the substrate, and is free to move or bend in response to the pressure of a sound wave incident upon a surface of the mobile electrode. Since the mobile electrode and the fixed electrode form a capacitor, bending of the membrane that forms the mobile electrode causes a variation in the value of the capacitance of the capacitor formed by the mobile and fixed electrodes. In operation, sound waves incident upon the mobile electrode cause variations in the capacitance of the MEMS microphone. These variations in capacitance are converted into an electrical signal indicative of the incident sound wave, and this electrical signal is supplied as an output signal of the MEMS microphone.

The manufacturing of MEMS microphones may be done through conventional semiconductor processing techniques. Thus, as with the formation of conventional integrated circuits, the manufacturing of the sensor includes the formation of a number of the sensors on a semiconductor wafer. Each of these sensors may be termed a die on the semiconductor wafer and must be separated as part of forming the individual sensors for individual MEMS microphones. Typically, separating or dicing these individual sensors is done through a laser cutting process and there is a need for improving this laser cutting process.

BRIEF SUMMARY

One embodiment of the present disclosure is directed to a transducer including a first substrate and an integrated circuit coupled to the first substrate. A sensor is electrically coupled to the integrated circuit and includes a second substrate having a first surface and a second surface opposite the first surface. The second substrate has scribe boundaries defining an outer edge of the second substrate and includes at least one chamber extending from the first surface towards but not reaching the second surface. At least one chamber extends from the second surface towards the first surface to meet the at least one chamber extending from first surface. Scribe trenches are formed in the second surface at the scribe boundaries, each scribe trench having a width extending from the scribe boundary towards the at least one chamber extending from the second surface towards but not reaching the at least one chamber extending from the second surface. At least one membrane extends over the first surface of the second substrate and each membrane extends over a respective at least one chamber extending from first surface. At least one plate extends from the first surface of the second substrate over a corresponding one of the at least one membranes.

Another embodiment of the present disclosure is directed to a method of forming semiconductor devices, such as capacitive type MEMS acoustic transducers, in a semiconductor wafer. The method includes forming a mask layer on a back surface of the semiconductor wafer and removing first etch portions of the mask layer and scribe trench portions of the mask layer. Each scribe trench portion is positioned in the mask layer to define a corresponding scribe boundary of a plurality of the semiconductor devices being formed in the semiconductor wafer. Etching the semiconductor wafer through the first etch portions and the scribe trench portions may be done simultaneously to form external back chambers and scribe trenches, respectively, in the semiconductor wafer. The semiconductor wafer is then cut along cutting lines in the scribe trenches to singulate individual MEMS acoustic transducers. Prior to etching the semiconductor wafer through the first etch portions and the scribe trench portions, the method includes removing second etch portions of the mask layer and etching the semiconductor wafer through the second etch portions to form internal back chambers. The etching through the first and second etch portions and the scribe trench portions are dry etching of the semiconductor substrate in one embodiment.

BRIEF DESCRIPTION OF THE SEVERAL VIEWS OF THE FIGURES

One or more embodiments will now be described, by way of example only, with reference to the annexed figures, in which:

FIG. 4A is a cross-sectional view showing a process for the formation of the internal back chambers and preparation for forming the external back chamber and scribe trenches for one of the sensors in the semiconductor wafer of FIG. 2 according to one embodiment of the present disclosure.

FIG. 4B is a cross-sectional view showing a process for the formation of the scribe trenches along with the external back chamber for the sensor of FIG. 4A after formation of the internal back chambers according to an embodiment of the present disclosure.

DETAILED DESCRIPTION

Figure 1:
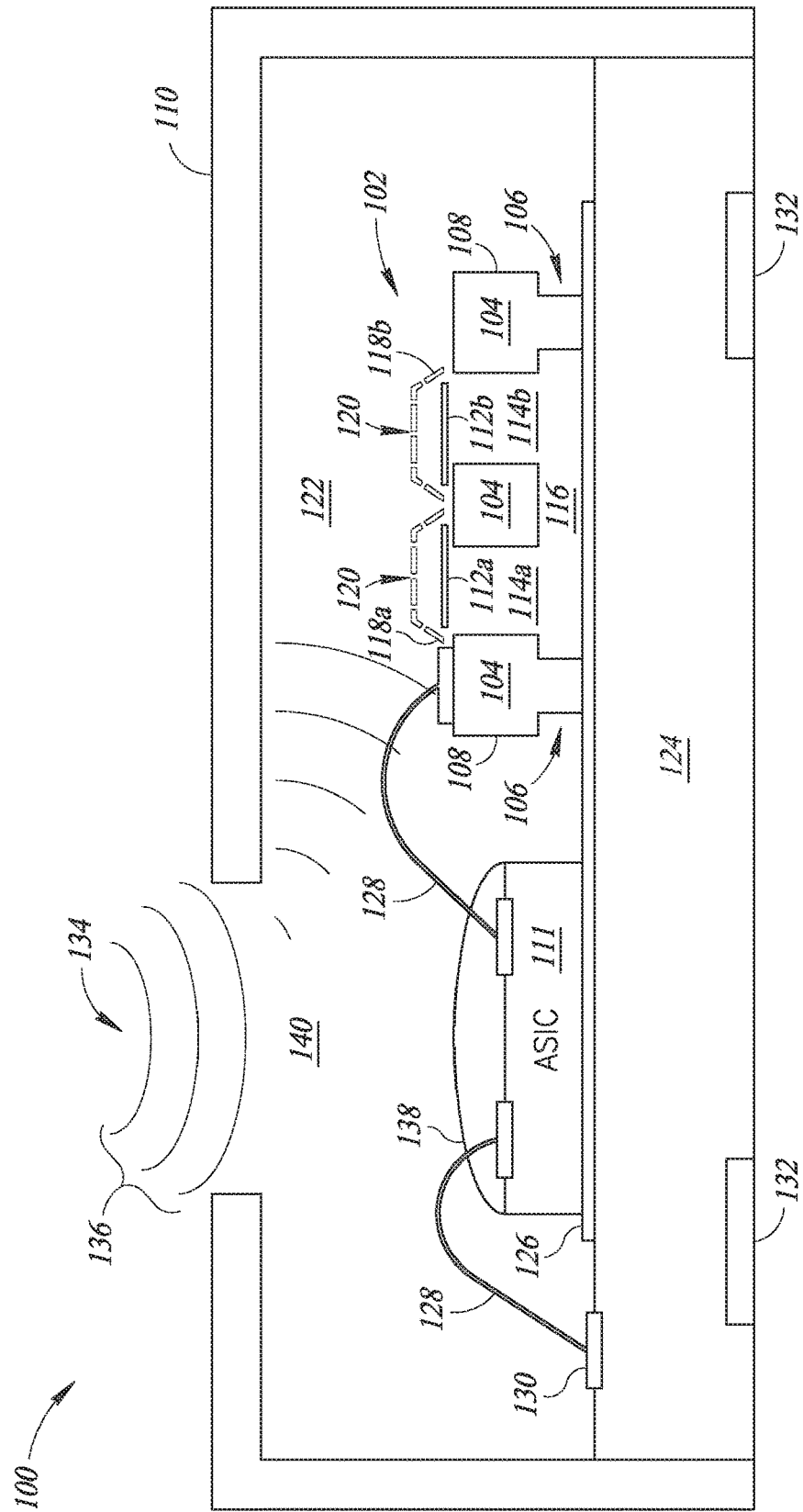
FIG. 1 is a simplified cross-sectional view of a MEMS acoustic transducer or microphone including a sensor formed according to embodiments of the present disclosure.

FIG. 1 is a simplified cross-sectional view of a MEMS acoustic transducer or microphone 100 including a detection structure or sensor 102 formed according to embodiments of the present disclosure. The sensor 102 includes a sensor body or substrate 104 having scribe trench portions 106 extending inward from scribe boundaries 108 of the substrate. The scribe trench portions 106 result from scribe trenches and subsequent laser cutting along these scribe trenches during the manufacture of the sensor 102, as will be described in more detail below. These scribe trenches reduce the time required to fabricate the sensor 102 and the resulting scribe trench portions 106 can help reduce the size of a package 110 housing the sensor 102 and an application specific integrated circuit (ASIC) 111 of the MEMS microphone 100, as will also be described in more detail below.

In the present description, certain details are set forth in conjunction with the described embodiments to provide a sufficient understanding of the present disclosure. One of ordinary skill in the art will appreciate, however, that embodiments of the present disclosure may be practiced without these particular details. Furthermore, one of ordinary skill in the art will appreciate that the present disclosure is not limited to the example embodiments described herein, and will also understand that various modifications, equivalents, and combinations of the disclosed embodiments, and components thereof, are within the scope of the present disclosure. Embodiments including fewer than all the components of any of the respective described embodiments may also be within the scope of the present disclosure although not expressly described in detail herein. Also, the operation of well-known components, structures, and/or processes has not been shown or described in detail below to avoid unnecessarily obscuring the present disclosure. Also, in the drawings, identical reference numbers identify similar elements or acts while the sizes and relative positions of elements in the drawings are not necessarily drawn to scale. For example, the shapes of various elements and angles are not necessarily drawn to scale, and some of these elements may be arbitrarily enlarged, or may be positioned to improve drawing legibility or to more clearly illustrate a particular aspect of the present disclosure. Further, the particular shapes of the elements as drawn are not necessarily intended to convey any information regarding the actual shape of the particular elements, and may have been solely selected for ease of illustration or description in the drawings. Finally, note that in the description below where more than one of a particular type of element or component is shown in the figures, each such component may be labeled with a corresponding reference number and letter. In this situation, when referring to a particular one or ones of the components both the number and letter designations will be utilized, while the letter designation will be omitted when referring to any or all of the components.

In the sensor 102, the sensor substrate 104 is typically made of a semiconductor material such as silicon. The sensor 102 includes movable electrodes membranes 112a 112b, each membrane being flexible so as to experience a deformation or movement in response to incident acoustic pressure or sound waves. Each membrane 112a, 112b extends over a corresponding opening or internal back chamber 114a, 114b in the substrate 104 and is fixed at its ends to the substrate. Forming the membranes 112a, 112b extending over the internal back chambers 114a and 114b allows the membranes to flex or move responsive to the incident acoustic waves. Each membrane 112a, 112b is typically formed from a conductive material, such as polysilicon, having a suitable thickness to provide the desired flexibility of the membrane. Other suitable structures may be utilized for each membrane 112a, 112b, such as an insulating layer having a suitable flexibility with a conductive layer formed on the insulating layer or portions of the insulating layer. The sensor 102 further includes an external opening or external back chamber 116, with the internal back chambers 114a, 114b in combination with the external back chamber forming the back chamber of the sensor, as will be discussed in more detail below.

The sensor 102 further includes fixed electrodes or back plates 118a and 118b positioned proximate the membranes 112a and 112b, respectively. Each back plate 118a, 118b is also attached at its ends to the substrate 104, but unlike the membrane is formed from a suitably rigid material such that the back plate experiences no movement or deformation in response to incident acoustic waves. Typically, each back plate 118 is formed from an insulating layer having a suitable rigidity, such as a nitride layer, with a suitable conductive layer like polysilicon formed on the nitride layer or portions thereof. In addition, each back plate 118 includes openings or holes 120 formed in the back plate to allow acoustic waves to propagate from a front chamber 122 of the sensor 102 through the back plate and over the membranes 112 to the back chamber 116, as will be described in more detail below.

In the MEMS microphone 100, the substrate 104 of the sensor 102 is physically attached to an acoustic transducer or microphone substrate 124 in a suitable manner, such as through an adhesive layer 126 formed on an upper surface of the microphone substrate. The ASIC 111 is also physically attached to the microphone substrate 124 through the adhesive layer 126. The ASIC 111 includes suitable electronic circuitry for processing a sensor signal generated by the sensor 102 and provides a microphone output signal having a value that is a function of an acoustic wave incident upon the MEMS microphone 100. The ASIC 111 is electrically connected through bonding wires 128, one of which is shown in FIG. 1, to the sensor 102 to receive the sensor signal. The ASIC 111 is further coupled through bonding wires 128, again only one of which is shown in FIG. 1, to contact pads 130 on the upper surface of the microphone substrate 124. The microphone substrate 124 includes one or more conductive layers (not shown) that electrically couple contact pads 130 on the upper surface of the microphone substrate to contact pads 132 on a lower surface of the microphone substrate. The MEMS microphone 100 is electrically coupled to external electronic circuitry (not shown) through the contact pads 132 on the lower surface of the microphone substrate 124.

As seen in FIG. 1, the ASIC 111 is positioned on the microphone substrate 124 underneath an aperture 134 on the upper or top surface of the package 110. The aperture 134 is termed a "top acoustic port" because acoustic waves 136 that propagate through the top acoustic port are sensed by the MEMS microphone 100. The ASIC 111 includes a protective layer 138 formed on top of the ASIC to protect the ASIC from light and other environmental factors surrounding the MEMS microphone 100 that could possibly adversely affect the ASIC. Acoustic waves 136 traveling through the top acoustic port 134 enter an internal cavity 140 defined by the package 110 and the microphone substrate 124 with the sensor 102 and ASIC 111 mounted thereon.

In operation of the MEMS microphone 100, a portion of acoustic waves 136 traveling downward in FIG. 1 propagate through the top acoustic port 134 and into the internal cavity 140. The acoustic waves 136 propagating through the top acoustic port 134 then reflect off the protective layer 138, with a portion of these reflected acoustic waves being directed towards the right to the front chamber 122 of the sensor 102. A portion of the reflected acoustic waves 136 in the front chamber 122 thereafter propagate through the holes 120 in the back plates 118 and impinge upon or are incident on the membranes 112 of the sensor 102. The membranes 112 and back plates 118 form a variable capacitance having a value that varies as a function of the acoustic waves 136 that propagate through the front chamber 122 and the holes 120 in the back plates 118 and are incident upon the membranes.

The acoustic waves 136 incident upon the membranes 112 cause the membranes to deform or move relative to the back plates 118, which causes a variation in the gap or distance between the membranes and the back plates and thereby a variation in the capacitance formed by the back plates and the membranes. The ASIC 111 applies an electrical signal across the variable capacitance formed by the membranes 112 and back plates 118 and detects variations in this electrical signal which varies as a function of the capacitance and thereby as a function of the acoustic waves 136 incident upon the membranes. The ASIC 111 processes the electrical sensor signal from the sensor 102 to generate the microphone output signal that is provided on contact pads 132 of the MEMS microphone 100 to external electronic circuitry (not shown) for utilization by that external circuitry.

The performance of the MEMS microphone 100 depends upon the volume of the back chamber, which includes the volumes of the internal chambers 114a and 114b and the external chamber 116, and the volume of the front chamber 122. More specifically, the volume of the front chamber 122 determines an upper resonance frequency of the MEMS microphone 100 and thereby determines the performance of the MEMS microphone at high frequencies of the acoustic waves 136. In general, the smaller the volume of the front chamber 122 the higher the upper cut-off frequency of the MEMS microphone 100. Regarding the back chamber of the sensor 102, a larger volume for the back chamber improves the frequency response and the sensitivity of the MEMS microphone 100. This is why dual internal chambers 114a and 114b in combination with the external chamber 116 are utilized in the sensor 102. The external chamber 116 extends in a horizontal direction, namely parallel to the upper surface of the microphone substrate 124, to a greater extent than do the internal chambers 114a and 114b, which increases the overall volume of the back chamber of the sensor 102.

The present disclosure is directed to methods of forming the sensor 102 and the sensor including the scribe trench portions 106 formed according to these methods. Therefore, the detailed structure and operation of the sensor 102 as well as the detailed structure and operation of the ASIC 111 in processing the sensor signal from the sensor will not be described in more detail herein. The details regarding these structures and operation will be understood by those skilled in the art. For example, U.S. Patent Application Publication No. US2014/0353780A1 describes in detail the structure and operation of a detection structure or sensor for a MEMS microphone, and this reference is hereby incorporated herein in its entirety to the extent the disclosure in this reference is not inconsistent with the present disclosure. In the sensor 102, for example, the particular shapes and structures of the membranes 112a, 112b and the back plates 118a, 118b may vary in different embodiments of the sensor.

Figure 2:
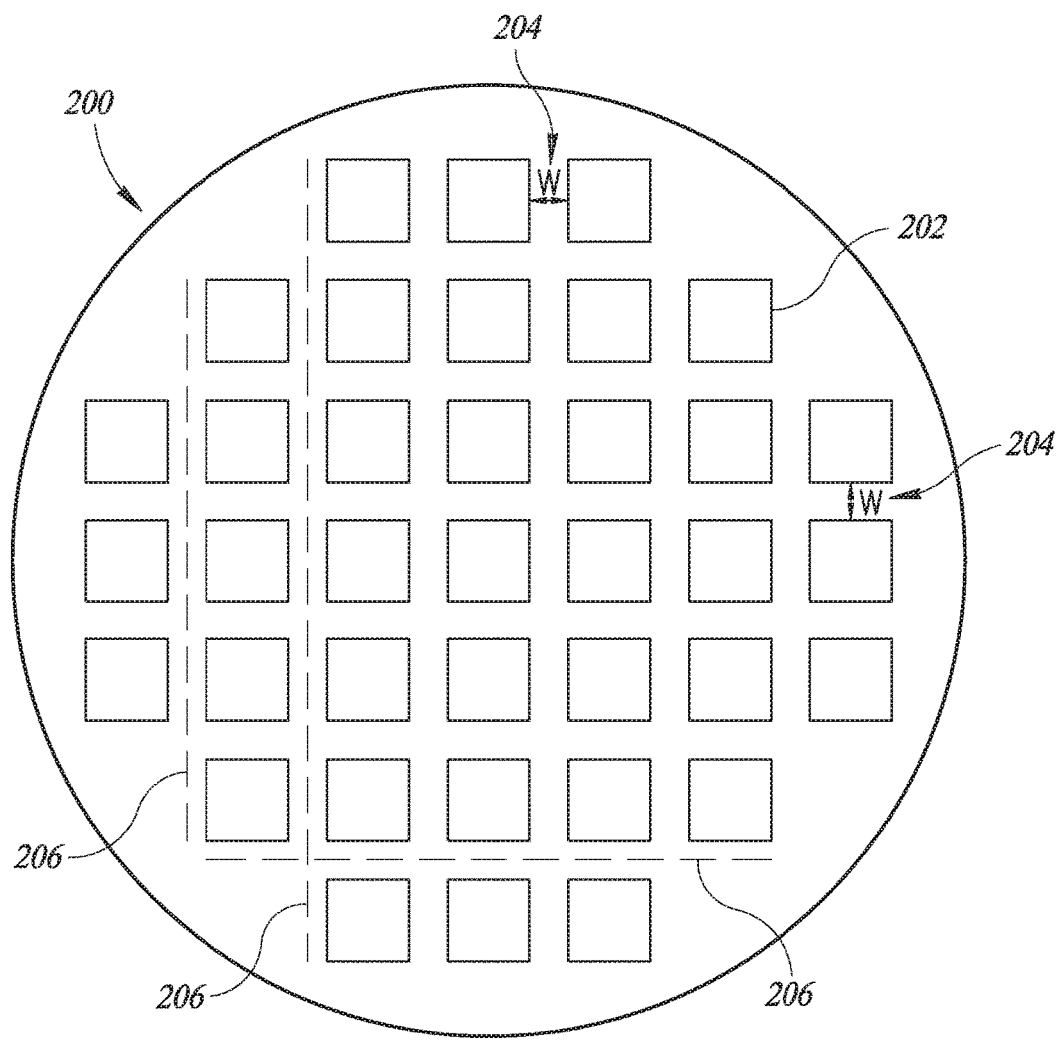
FIG. 2 is a top view of a semiconductor wafer including a number of the sensors of FIG. 1 with scribe trenches formed between the sensors according to one embodiment of the present disclosure.

Referring now to FIG. 2, this figure is a top view of a semiconductor wafer 200 including a number of integrated circuits 202 formed on the wafer with scribing streets 204 formed between the integrated circuits according to one embodiment of the present disclosure. Only some of the scribing streets 204 are labeled in FIG. 2 to simplify the figure. The integrated circuits 202 are singulated from the semiconductor wafer 200 through a laser cutting process along the scribing streets 204, as will be described in more detail below. Each of these singulated integrated circuits is a die including the required components to form one of the sensors 102 of FIG. 1. Each of the scribing streets 204 has a width W and includes a scribe trench, which is represented in FIG. 2 as a dotted line 206 for several of the scribing streets. As will be described in more detail, the laser cutting of the semiconductor wafer 200 occurs along the scribe trenches 206. In lieu of laser cutting, singulation of the integrated circuits could be done through another dry cutting process such as with a diamond blade.

Figure 3A:
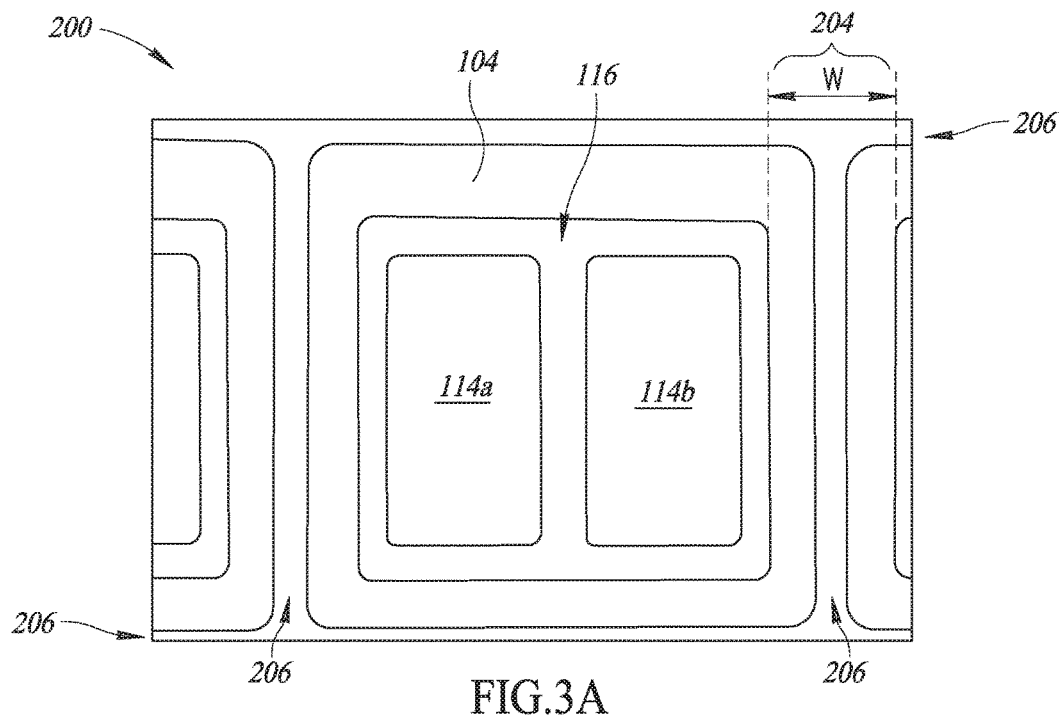
FIG. 3A is a bottom view of a portion of the semiconductor wafer of FIG. 2 showing back chambers of one sensor substrate along with scribe trenches formed between adjacent sensor substrates according to one embodiment of the present disclosure.
Figure 3B:
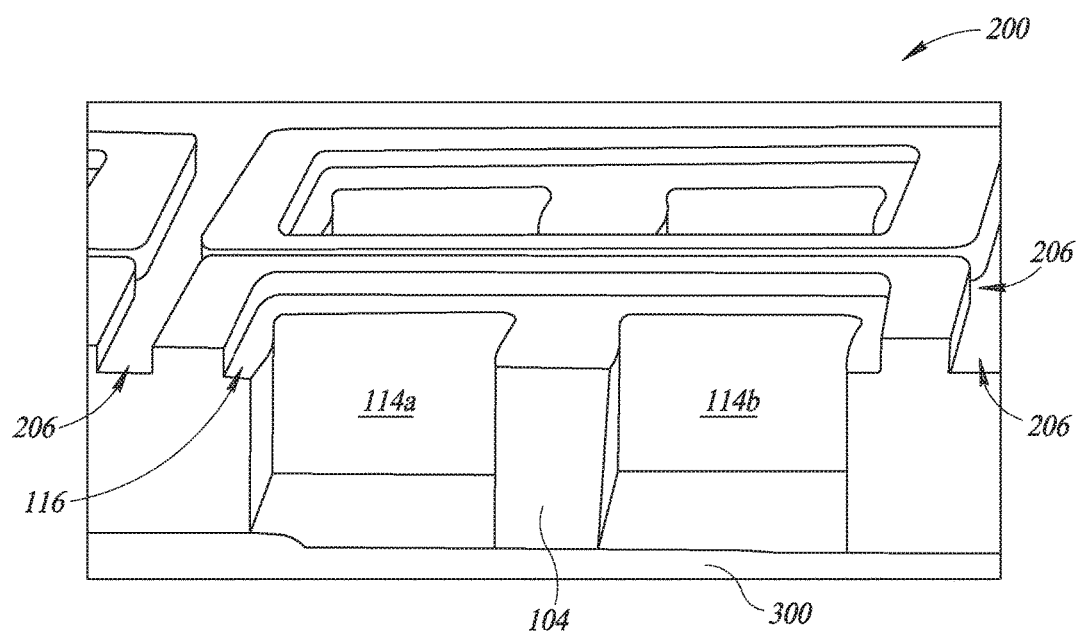
FIG. 3B is cross-sectional perspective view of a portion of the semiconductor wafer of FIG. 2 showing the back chambers of one sensor substrate along with the scribe trenches formed between adjacent sensor substrates according to one embodiment of the present disclosure.

FIG. 3A is a bottom view of a portion of the semiconductor wafer 200 of FIG. 2 showing the semiconductor substrate 104 including the dual internal back chambers 114a and 114b and the external back chamber 116 of one sensor 102 before the sensor has been singulated from the semiconductor wafer. FIG. 3A also labels the scribing street 204 having the width W to the right of the back chambers 114 and 116 and shows the scribe trenches 206 running along the top, bottom left and right of the back chambers. A portion of the semiconductor substrates 104 to the left and right of the labeled semiconductor substrate in the middle are also seen in FIG. 3A. FIG. 3B is a cross-sectional perspective view of a portion of the semiconductor wafer 200 of FIG. 2 again showing the semiconductor substrate 104 including the dual internal back chambers 114a and 114b and the external back chamber 116 of one sensor 102 before the sensor has been singulated from the semiconductor wafer. As seen in FIG. 3B, the illustrated portion of the semiconductor substrate 200 includes a surface layer 300 shown on the bottom of the figure. This surface layer 300 is present during fabrication of the scribe trenches 206 and internal back chambers 114 and external back chamber 116 but will of course later be removed during subsequent fabrication steps such as formation of the membranes 112 and back plates 118, with these components having been previously described with reference to FIG. 1.

By including the scribe trenches 206 in the scribing streets 204 between the integrated circuits 202, the time required to singulate the integrated circuits to thereby form respective sensors 102 is reduced. In addition, the scribe trenches 206 result in the semiconductor substrate 104 of each sensor 102 including the scribe trench portions 106 (FIG. 1), which improves a tolerance T from scribe boundaries 108 of the substrate and thereby reduces the overall size of the sensor 102. The reduced singulation time resulting from the scribe trenches 206 and the scribe trench portions 106 will be discussed in more detail below with reference to FIGS. 7 and 8.

FIG. 4A is a cross-sectional view showing a process for the formation of the internal back chambers 114 and preparation for forming the external back chamber 116 and scribe trenches 206 for one of the sensors 102 in the semiconductor wafer 200 of FIG. 2 according to one embodiment of the present disclosure. Initially, a suitable mask layer 400 is formed on the upper surface of the semiconductor substrate 104. The mask layer 400 may be any suitable type of mask layer, such as a silicon dioxide layer formed using Tetraethyl Orthosilicate (TEOS) or an undoped silicate glass (USG) layer. The internal back chambers 114 are formed through a deep silicon etch of the semiconductor substrate 104.

Prior to performing this deep silicon etch, internal back chamber portions 402 of the mask layer 400 are removed. Although shown in FIG. 4A, at this point in the process an external back chamber portion 404 and scribe trench portion 406 of the mask layer 400 have not yet been removed such that the mask layer 400 covers the upper surface of the semiconductor substrate 104 except for the internal back chamber portions 402. Thus, with the internal back chamber portions 402 of the mask layer 400 having been removed a deep silicon etch is performed on the semiconductor substrate 104 to form the internal back chambers 114. After formation of the internal back chambers 114, the external back chamber portion 404 and scribe trench portion 406 of the mask layer 400 are then removed as shown in FIG. 4A. A structure 408 formed on a lower surface of the semiconductor substrate 104 is also illustrated in FIG. 4A. This structure 408 is associated with the formation of additional components of the sensor 102 being formed, such as layers associated with the membranes 112 and back plates 118, which have already been formed at this point in the fabrication process of the sensor 102 according to the illustrated embodiment.

Once the external back chamber portion 404 and the scribe trench portion 406 of the mask layer 400 have been removed as illustrated in FIG. 4A, a second silicon etch of the semiconductor substrate 104 is then performed to thereby simultaneously form the external back chamber 116 and scribe trench 206 as illustrated in FIG. 4B. In this way, the formation of the scribe trenches 206 does not require the formation of any additional mask layers during fabrication of the sensor 102. The existing mask layer 400 utilized to form the internal back chambers 114 and external back chamber 116 is instead also utilized in forming the scribe trenches 206. In one embodiment, this pre-laser cutting second silicon etch is a dry silicon etch at the front-end of the process and which makes the subsequent dicing step through the laser cutting shorter, and increases tolerances the sensor 102 as will be described in more detail below.

Moreover, in forming the scribe trenches 206 in this way the duration of the process is not undesirably lengthened to form the scribe trenches 206. One skilled in the art will understand suitable silicon etching processes for forming both the internal back chambers 114 and the external back chamber 116 and scribe trenches 206. In one embodiment, a deep dry silicon etch having suitable process parameters is utilized in forming the chambers 114, 116 and scribe trenches 206.

Figure 5:
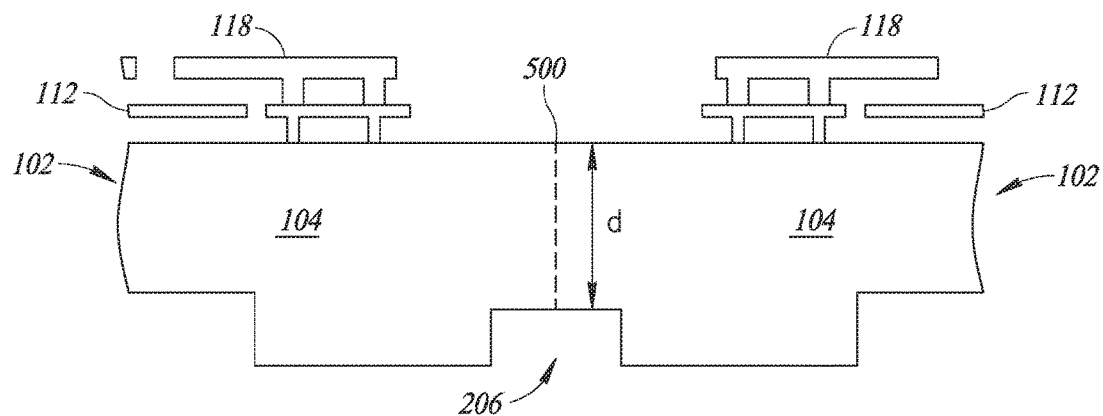
FIG. 5 is a cross-sectional view showing portions of adjacent sensors in the semiconductor wafer of FIG. 2 and laser cutting along one of the scribe trenches formed between these adjacent sensors according to one embodiment of the present disclosure.

FIG. 5 is a cross-sectional view showing portions of adjacent sensors 102 in the semiconductor wafer 200 of FIG. 2 and showing laser cutting along one of the scribe trenches 206 formed between these adjacent sensors according to one embodiment of the present disclosure. The laser cutting along the scribe trench 206 occurs along a laser cutting line 500 in approximately the center of the scribe trench as shown. Because of the scribe trench 206, the semiconductor substrate 104 has a thickness or depth d at the point of the laser cutting line 500 that is less than an overall thickness or depth of the semiconductor substrate, as seen for the portions of the semiconductor substrate to the left and right of the scribe trench. This reduced depth d at the laser cutting line 500 means that the time to perform the laser cutting along the laser cutting line is reduced. This improves the overall process of fabricating the sensors 102 by reducing the time it takes to singulate the sensors from the semiconductor wafer 200. Furthermore, the scribe trench 206 and reduced depth d that must be cut through on the cutting line 500 means that fewer unwanted particles are generated during this laser cutting process. Fewer particles is desirable because these particles and land on unwanted places on the semiconductor wafer 200 and sensors 102 being formed thereon and interfere with the proper operation of sensor 102 after singulation, as will be appreciated by those skilled in the art. In FIG. 5, portions of one of the membranes 112 and back plate 118 are also shown in FIG. 5 for each of the sensors 102 illustrated in the figure. A diameter of the laser that cuts the semiconductor substrate 104 along the cutting line 500 defines a width of the cutting line and this width of the cutting line is significantly less than a width of the scribe trench 206 such that the scribe trench portions 106 are formed during the laser cutting as shown in FIGS. 1 and 6.

Figure 6:
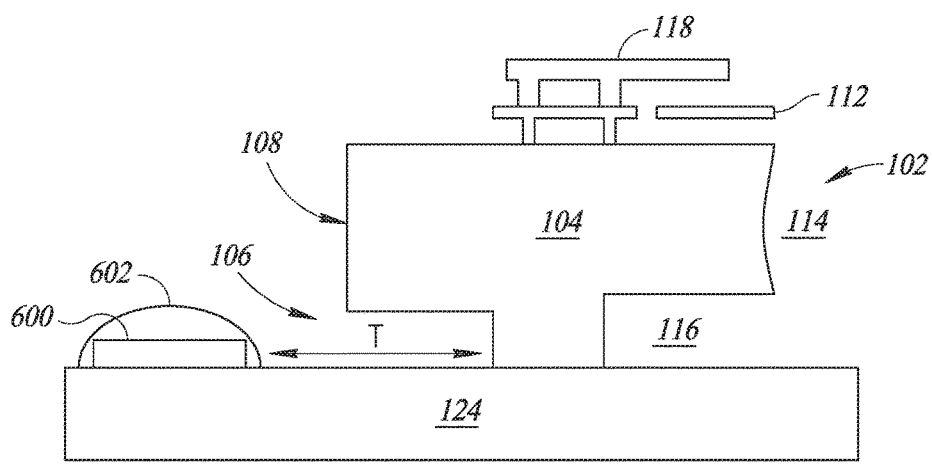
FIG. 6 is a cross-sectional view showing a portion of one of the sensors of FIG. 5 and the scribe boundary of this sensor formed by the laser cutting along the scribe trench of FIG. 5.

FIG. 6 is a cross-sectional view showing a portion of one of the sensors 102 of FIG. 5 and the scribe boundary 108 (see FIG. 1) of this sensor formed by the laser cutting along the laser cutting line 500 in the scribe trench 206 of FIG. 5. Also shown in FIG. 6 is a portion of the microphone substrate 124 on which the sensor 102 is mounted as previously described with reference to FIG. 1. The laser cutting along the laser cutting line 500 forms the scribe boundary 108 of the semiconductor substrate 104 of the singulated sensor 102 and the semiconductor substrate 104 also includes the scribe trench portion 106, as previously described with reference to FIG. 1. As seen in FIG. 6, the dual internal back chambers 114 extend to a depth (i.e., vertically in FIG. 6) from the front surface of the semiconductor substrate 104 and partially towards the back surface of the substrate. The external back chamber 116 extends from the back surface of the semiconductor substrate 104 towards the front surface of the substrate and to a depth sufficient to meet the dual internal back chambers 114. The scribe trench portions 106 are formed in the back surface of the semiconductor substrate 104 at the scribe boundaries 108. Each scribe trench portion has a width extending laterally (i.e., from left-to-right in FIG. 6) from the scribe boundary 108 towards the external back chamber 116, but the width of the scribe trench portion 106 is such that the scribe trench portion does not meet the external back chamber 116. Each scribe trench portion 106 has a depth extending from the back surface of the substrate 104 towards the front surface of the substrate that is approximately equal to the depth of the external back chamber 116 from the back surface of the substrate.

Due to the presence of the scribe trench portion 106, the tolerance T from which a contact pad 600 shown covered with solder paste 602 results in the contact pad being closer to the scribe boundary 108 that is possible and conventional MEMS sensors. This is true because the tolerance T is measured from an interior vertical portion of the scribe trench portion 106 furthest from the scribe boundary 108 instead of from the scribe boundary itself as in conventional MEMS sensors. Thus, the overall size of the package 110 of the MEMS microphone 100 of FIG. 1 may be reduced since these contact pads 600 may be positioned closer to the scribe boundary 108 of the semiconductor substrate 104 of the sensor 102. Thus, the scribe trench portions 106 formed in the semiconductor substrate 104 of the sensor 102 reduce the effective die footprint of the sensor, allowing larger tolerances in back end processes such as electrical interconnections to the sensor 102, ASIC 111 and microphone substrate 124. In addition, where the adhesive layer 126 (FIG. 1) is a glue layer the scribe trench portions 106 provide better glue containment during placement of the die (i.e., the singulated sensor 102).

Figure 7:
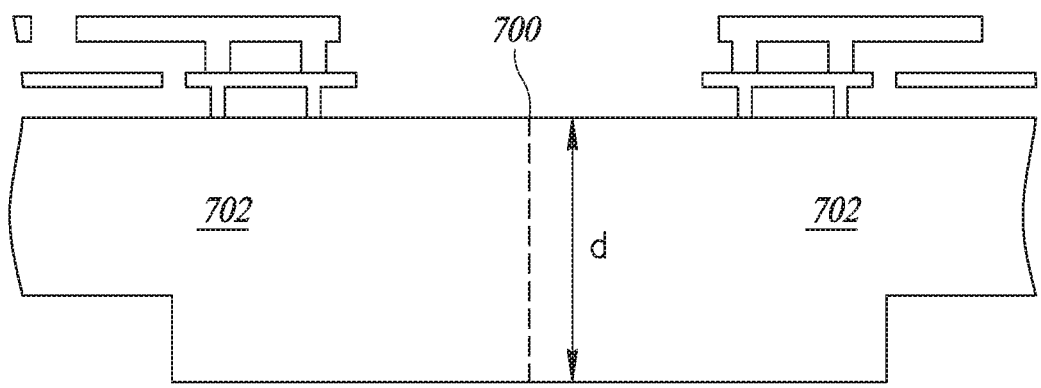
FIG. 7 is a cross-sectional view showing portions of adjacent sensors in a semiconductor wafer and conventional laser cutting of these adjacent sensors.
Figure 8:
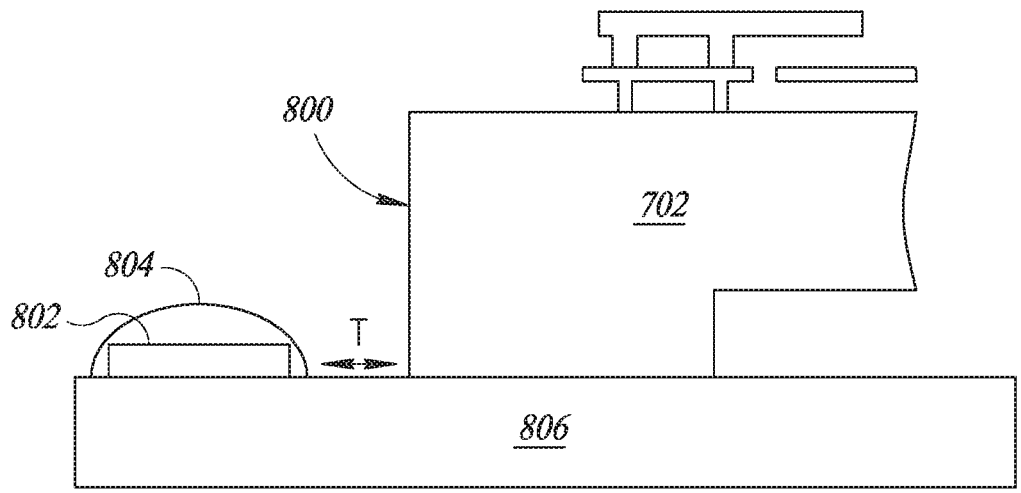
FIG. 8 is a cross-sectional view showing a portion of one of the sensors of FIG. 7 and a scribe boundary of this sensor formed by the conventional laser cutting of FIG. 7.

FIGS. 7 and 8 illustrate conventional laser cutting to singulate MEMS sensors. As seen in FIG. 7 the depth d of a semiconductor substrate 702 that must be cut through the laser cutting process corresponds to the entire thickness of the semiconductor substrate and would therefore take a longer time to perform in comparison to the cutting process described with reference to the structure of FIG. 5. FIG. 8 shows a scribe boundary 800 of the conventional singulated MEMS sensor and shows how the tolerance T from the scribe boundary must be maintained relative to a contact pad 802, once again showed covered in solder paste 804, on a microphone substrate 806, increasing the size of a MEMS microphone including this conventional sensor structure.

Although embodiments of the present disclosure have been described as being directed to capacitive type MEMS acoustic sensors or microphones, the present disclosure is not limited to these embodiments. For example, the concepts described above may be applied to different types of devices other than MEMS microphones, such as digital micromirror devices (DMDs) and more generally to devices that require a dry dicing method, such as laser cutting, and having a back surface or side trench etch. The front surface or side of the sensor 102 is the side on which the membranes 114 and back plates 118 are formed while the back side of the sensor is the side on which the external back chamber 116 and scribe trenches 206 are formed.

Figure 9:
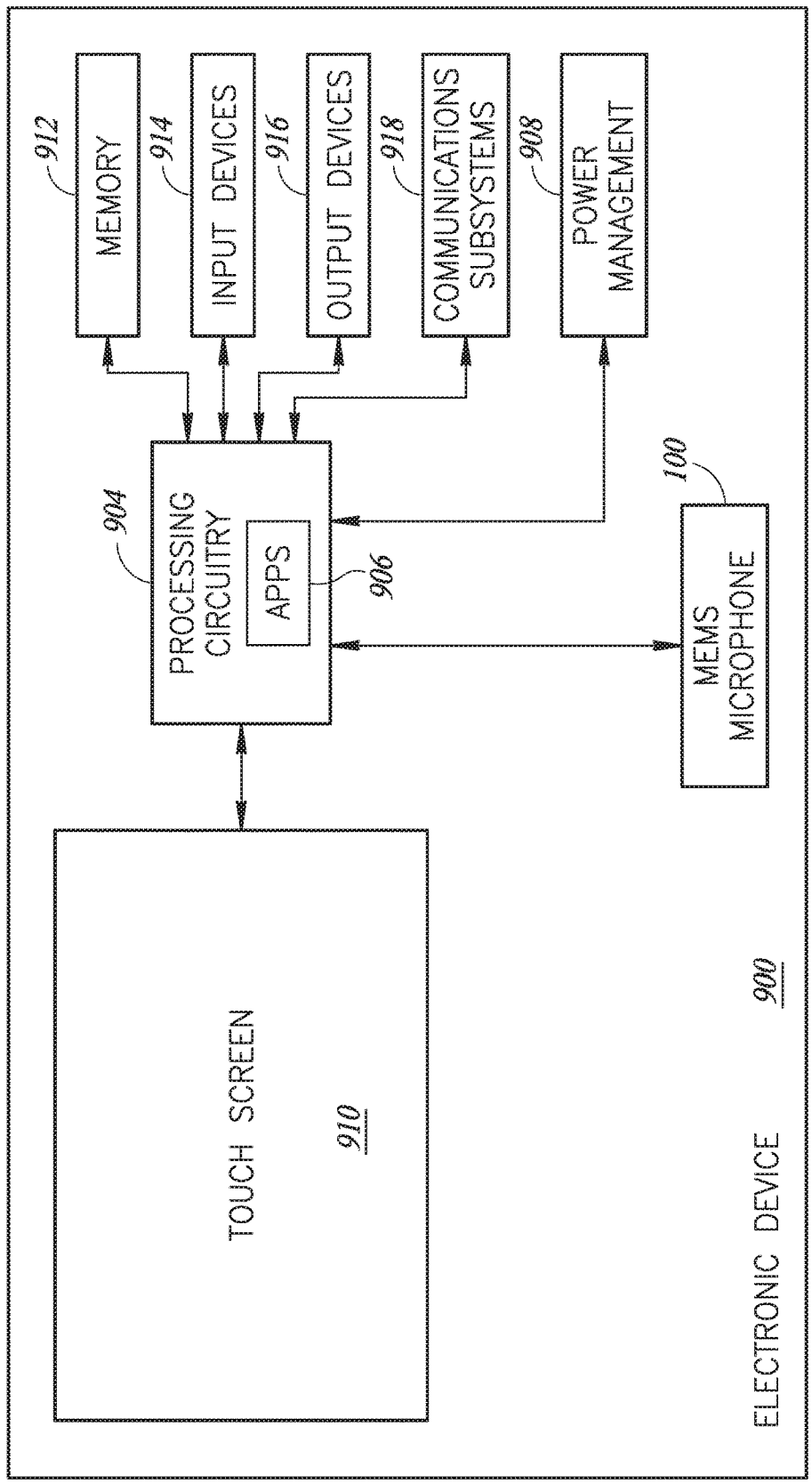
FIG. 9 is a functional block diagram of an electronic device including the MEMS microphone of FIG. 1 according to a further embodiment of the present disclosure.

FIG. 9 is a functional block diagram of an electronic device 900 including the MEMS microphone 100 of FIG. 1 according to a further embodiment of the present disclosure. The electronic device 900 includes processing circuitry 904 that is coupled to the MEMS microphone 100 to receive a signal indicative of acoustic waves sensed by the microphone, as previously discussed with reference to FIG. 1. The MEMS microphone 100 in the electronic device 900 may have a "top port" configuration as does the embodiment of FIG. 1 with the top acoustic port 134, but may also have different configurations in different embodiments of the disclosure. The MEMS microphone 100 could, for example, have a bottom port configuration where the acoustic port 134 is located on a bottom surface of the package 110 in different embodiments of the electronic device 900.

The processing circuitry 904 also controls the overall operation of the electronic device and also executes applications or "apps" 906 that provide specific functionality for a user of the electronic device 900. A power management subsystem 908 of the electronic device 900 is coupled to the processing circuitry 904 and may include a battery for powering the electronic device 900 and also control circuitry for controlling power-related operating modes of the device such as charging of the battery, power-savings modes of operation, and so on. The electronic device 900 further includes a video component such as a touch screen 910 with a touch display (not shown) such as a liquid crystal display (LCD) and a touch panel (not shown) attached to or formed as an integral part of the touch display. In operation, the touch screen 910 senses touches of a user of the electronic device 900 and provides sensed touch information to the processing circuitry 904 to thereby allow the user to interface with and control the operation of the electronic device. The processing circuitry 904 also controls the touch screen 910 to display desired visual content on the touch display portion of the touch screen.

The electronic device 900 further includes data storage or memory 912 coupled to the processing circuitry 904 for storing and retrieving data including the apps 906 and other software executing on the processing circuitry and utilized by the electronic device during operation. Examples of typical types of memory 912 include solid state memory such as DRAM, SRAM and FLASH, solid state drives (SSDs), and may include any other type of memory suited to the desired functionality of the electronic device 900 including digital video disks (DVDs), compact disk read-only (CD-ROMs), compact disk read-write (CD-RW) memories, magnetic tape, hard and floppy magnetic disks, tape cassettes, and so on.

Input devices 914 are coupled to the processing circuitry 904 and may include a keypad, whether implemented through the touch screen 910 or separately, a pressure sensor, accelerometer, keyboard, mouse, digital camera to capture still and video images, and other suitable input devices. The MEMS microphone 100 may be considered one of the input devices 914. Output devices 916 are coupled to the processing circuitry 904 and may include, for example, audio output devices such as a speaker, printer, vibration device, and so on. The input devices 914 and output devices 916 collectively may include other types of typical communications ports for the electronic device 900, such as USB ports, HDMI ports, and so on. The electronic device 900 further includes communications subsystems 918 coupled to the processing circuitry 904 and which may include Wi-Fi, GPS, cellular and Bluetooth subsystems for providing the device with the corresponding functionality.

The specific type and number of input devices 914, output devices 916, communications subsystems 918, and even the specific functionality of the power management subsystem 908 will of course depend on the type of the electronic device 900, which may be any suitable type of electronic device or system. The electronic device 900 is in one embodiment a mobile-communications device, such as, for example, a cell phone, smart phone, personal digital assistant (PDA), a laptop computer such as a notebook or ultrabook computer, a personal computer system, a voice recorder, a reader of audio files with voice-recording capacity, and so on. Alternatively, the electronic device 900 may be a hydrophone capable of working under water.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transducer, comprising:
a first substrate;
an integrated circuit coupled to the first substrate;
a sensor electrically coupled to the integrated circuit, the
sensor including a second substrate having a first surface and a second surface opposite the first surface, and having scribe boundaries defining an outer edge of the second substrate, the second substrate further including,
  at least one chamber extending from the first surface towards but not reaching the second surface;
  at least one chamber extending from the second surface towards the first surface to meet the at least one chamber extending from first surface; and
  scribe trenches formed in the second surface at the scribe boundaries, each scribe trench having a width extending from the scribe boundary towards the at least one chamber extending from the second surface towards but not reaching the at least one chamber extending from the second surface;
  at least one membrane extending over the first surface of the second substrate, each membrane extending over a respective at least one chamber extending from first surface; and
  at least one plate, each plate extending from the first surface of the second substrate over a corresponding one of the at least one membranes.

2. The transducer of claim 1, wherein each scribe trench portion has a depth that is approximately equal to a depth of the chamber extending from the second surface of the second substrate.

3. The transducer of claim 1, wherein the first substrate comprises a contact pad and the each scribe trench provides a tolerance distance including the width of the scribe trench between the second substrate and the contact pad that is greater than a tolerance distance between the scribe boundary and the contact pad.

4. The transducer of claim 1, wherein the at least one chamber extending from the first surface towards but not reaching the second surface includes two chambers.

5. The transducer of claim 4, wherein the at least one chamber extending from the second surface towards the first surface to meet the at least one chamber extending from first surface is a single chamber.

6. The transducer of claim 1, wherein the substrate of the sensor comprises a silicon substrate.

7. The transducer of claim 1, wherein each of the at least one membranes comprises a polysilicon layer.

8. The transducer of claim 1 further comprising a package that defines a front chamber of the sensor positioned with the at least one plate exposed in the front chamber, the package including a port through which waves propagate into the front chamber and through the front chamber to the at least on at least one plate.

9. The transducer of claim 8, wherein each of the at least one plates includes a plurality of openings configured to allow the waves that propagate through the front chamber to the at least on plate to further propagate through the openings in the at least one plate and to strike the at least one membrane.

10. The transducer of claim 9, wherein the package further comprises a top surface and a bottom surface, and wherein the port is formed in one of the top surface of the package the bottom surface of the package.

11. The transducer of claim 1, wherein each at least one plate comprises an insulating material layer having a conductive layer formed at least on portions of the insulating material layer.

12. A transducer, comprising:
  a transducer substrate;
  an integrated circuit electrically coupled to the transducer substrate;
  a sensor electrically coupled to the integrated circuit, the sensor including a substrate having a first surface and a second surface opposite the first surface, and having scribe boundaries defining an outer edge of the substrate, the substrate further including,
    dual chambers extending to a depth from the first surface partially towards the second surface;
    a chamber extending from the second surface towards the first surface to a depth to meet the dual chambers, and
    scribe trench portions formed in the second surface at the scribe boundaries, each scribe trench portion having a width extending from the scribe boundary towards the chamber extending from the second surface but not meeting this chamber, and each scribe trench portion having a depth that is approximately equal to the depth of the chamber extending from the second surface;
    dual membranes extending over the first surface of the substrate, each membrane extending over a respective one of the dual chambers; and
    dual plates extending over the dual membranes, each plate extending over and being spaced from a corresponding one of the dual membranes.

13. The acoustic transducer of claim 12, wherein the substrate of the sensor comprises a silicon substrate.

14. The acoustic transducer of claim 12, wherein each of the dual membranes comprises a polysilicon layer.

15. The acoustic transducer of claim 12, wherein each of the dual plates includes openings formed therein and includes an insulating layer with a conductive layer formed at least on portions of the insulating layer.

16. The acoustic transducer of claim 12 further comprising a package that defines a front chamber of the sensor positioned over the dual plates, the package comprising a port through which waves propagate into the front chamber and through the front chamber to the dual membranes of the sensor.

17. A method, comprising:
  forming a mask layer on a back surface of a semiconductor wafer;
  removing first etch portions of the mask layer;
  removing scribe trench portions of the mask layer, each scribe trench portion being positioned in the mask layer to define a corresponding scribe boundary of a plurality of semiconductor devices being formed in the semiconductor wafer;
  etching the semiconductor wafer through the first etch portions to form first etched regions in the semiconductor wafer;
  etching the semiconductor wafer through the scribe trench portions to form scribe trenches in the semiconductor wafer; and
  cutting the semiconductor wafer along cutting lines in the scribe trenches.

18. The method of claim 17, wherein etching the semiconductor wafer through the first etch portions and through the scribe trench portions comprise simultaneously etching the semiconductor wafer through the first etch portions and the scribe trench portions.

19. The method of claim 18 further comprises prior to removing the first etch portions and the scribe trench portion of the mask layer:
  removing second etch portions of the mask layer; and
  etching the semiconductor wafer through the second etch portions to form second etched regions in the semiconductor wafer.

20. The method of claim 19,
- wherein etching the semiconductor wafer through the second etch portions to form second etched regions in the semiconductor wafer comprises etching the semiconductor wafer through the second etch portions to form internal back chambers of capacitive type MEMS acoustic transducers; and
- wherein etching the semiconductor wafer through the first etch portions to form first etched regions in the semiconductor wafer comprises etching the semiconductor wafer through the first etch portions to form external back chambers of the capacitive type MEMS acoustic transducers.

* * * * *